(12) United States Patent
Pritsker et al.

(10) Patent No.: US 9,484,901 B1
(45) Date of Patent: Nov. 1, 2016

(54) INTERPOLATION CIRCUITRY AND METHODS

(71) Applicant: Altera Corporation, San Jose, CA (US)

(72) Inventors: Dan Pritsker, San Diego, CA (US); Colman C. Cheung, San Diego, CA (US)

(73) Assignee: Altera Corporation, San Jose, CA (US)

( * ) Notice: Subject to any disclaimer, the term of this patent is extended or adjusted under 35 U.S.C. 154(b) by 1 day.

(21) Appl. No.: 14/595,470

(22) Filed: Jan. 13, 2015

Related U.S. Application Data (60) Provisional application No. 62/069,025, filed on Oct. 27, 2014.

(51) Int. Cl.
*H03H 11/16* (2006.01)
*H03K 5/135* (2006.01)

(52) U.S. Cl.
CPC .................................. *H03K 5/135* (2013.01)

(58) Field of Classification Search
None
See application file for complete search history.

(56) References Cited

U.S. PATENT DOCUMENTS

| | | | | |
|---|---|---|---|---|
| 7,453,492 B2* | 11/2008 | Silverbrook | ......... | B41J 2/14314 348/207.2 |
| 8,384,458 B1* | 2/2013 | Huang | .................... | H03K 5/131 327/175 |
| 8,729,943 B2* | 5/2014 | Weng | .................... | H03K 5/135 327/231 |
| 2004/0120437 A1* | 6/2004 | Casper | .................... | H03K 5/135 375/355 |
| 2011/0224996 A1* | 9/2011 | Wang | .................... | H04L 7/0029 704/503 |
| 2014/0176213 A1* | 6/2014 | Rylov | .................. | H03H 11/265 327/237 |

* cited by examiner

*Primary Examiner* — Cassandra Cox
(74) *Attorney, Agent, or Firm* — Fletcher Yoder, P.C.

(57) ABSTRACT

Circuitry for interpolating a value based on a first plurality of samples from within a larger second plurality of samples includes storage for the second plurality of samples, including a plurality of sample memories corresponding in number to the first plurality of samples. Adjacent samples in the sample memories correspond to samples in the second plurality of samples that are separated by other samples numbering one less than that number. A first sample address into a first one of the sample memories is derived by dividing a floor of an index by the number. Respective circuitry for each respective other one of the sample memories derives a respective other sample address from the first sample address based on a remainder of dividing the floor of the index by the number. Shifting circuitry outputs selected samples in a second order under control of a value determined by the remainder.

23 Claims, 9 Drawing Sheets

INTERPOLATION CIRCUITRY AND METHODS

CROSS REFERENCE TO RELATED APPLICATION

This claims the benefit of U.S. Provisional Patent Application No. 62/069,025, filed Oct. 27, 2014, which is hereby incorporated by reference herein in its entirety.

FIELD OF THE INVENTION

This invention relates to circuitry and methods for implementing interpolation, and particularly for correctly ordering samples retrieved from memory for interpolation.

BACKGROUND OF THE INVENTION

Interpolation is a technique for approximating the value of a curve or waveform between points for which samples of the curve or waveform are available. Application of the technique may require subtracting a higher-index sample value from a lower-index sample value. Because any individual sample may be either the higher-index sample or the lower-index sample value depending on the particular point to be interpolated, in applications where real-time processing speed is important, double storage of all samples may be needed to avoid time-consuming reordering of the samples or negation of a negative difference.

SUMMARY OF THE INVENTION

In accordance with embodiments of the present invention, a set of samples is stored only once, and all samples for a particular point to be interpolated may be accessed on the same clock cycle.

The samples are binned into groups according to the degree of the interpolation to be performed. Thus, for linear interpolation, which is the simplest case, the set of samples is stored once but binned into two groups—even samples and odd samples. The point to be interpolated is processed to derive an address into each group to select one sample from each group, as explained in more detail below. The two samples are passed through a circuit, such as a cross-bar switch, which may invert the order of the samples based on an input that also is derived from the point to be interpolated, as described below.

Embodiments of the invention may be extended to higher-order interpolations. Thus, for cubic interpolations, involving four samples, the set of samples is stored once but binned into four groups. If the samples are identified as $A_n$, one group would include samples $A_0, A_4, A_8, A_{12}, \ldots$; a second group would include samples $A_1, A_5, A_9, A_{13}, \ldots$; a third group would include samples $A_2, A_6, A_{10}, A_{14}, \ldots$; and a fourth group would include samples $A_3, A_7, A_{11}, A_{15}, \ldots$. As in the linear case, the point to be interpolated is processed to derive an address into each group to select one sample from each group, as explained in more detail below. The four samples would be passed through a circuit which may rotate the order of the samples based on an input that also is derived from the point to be interpolated, as described below. In this case, rather than a cross-bar switch, the circuit could be a circular barrel shifter.

It should be apparent from these examples that present invention allows the universe of samples to be stored only once, and allows all samples to be accessed in one clock cycle.

Therefore, in accordance with embodiments of the present invention there is provided interpolation circuitry for interpolating a value based on a first plurality of samples from within a larger second plurality of samples. The interpolation circuitry includes storage for the second plurality of samples, including a plurality of sample memories corresponding in number to the first plurality of samples, wherein samples in the second plurality of samples are distributed uniformly among the plurality of sample memories, so that each pair of adjacent samples in one of the sample memories corresponding to samples in the second plurality of samples is separated by other samples numbering one less than that number. Circuitry that receives an input index corresponding to the value derives a first sample address into a first one of the sample memories by dividing a floor of the index by the number. Respective circuitry for each respective other one of the sample memories derives a respective other sample address from the first sample address based on a remainder of dividing the floor of the index by the number. Shifting circuitry receives as inputs, in a first order, samples selected by the first sample address and each respective other sample address, and outputs the selected samples in a second order under control of a value determined by the remainder.

A method of operating such circuitry, and a method of configuring such circuitry in a programmable integrated circuit device, also are provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Interpolation has many practical applications. For purposes of illustration only, circuitry and methods for performing interpolation will be described herein in the context of back-projection in digital Synthetic Aperture Radar (or Sonar) systems.

Figure 1:
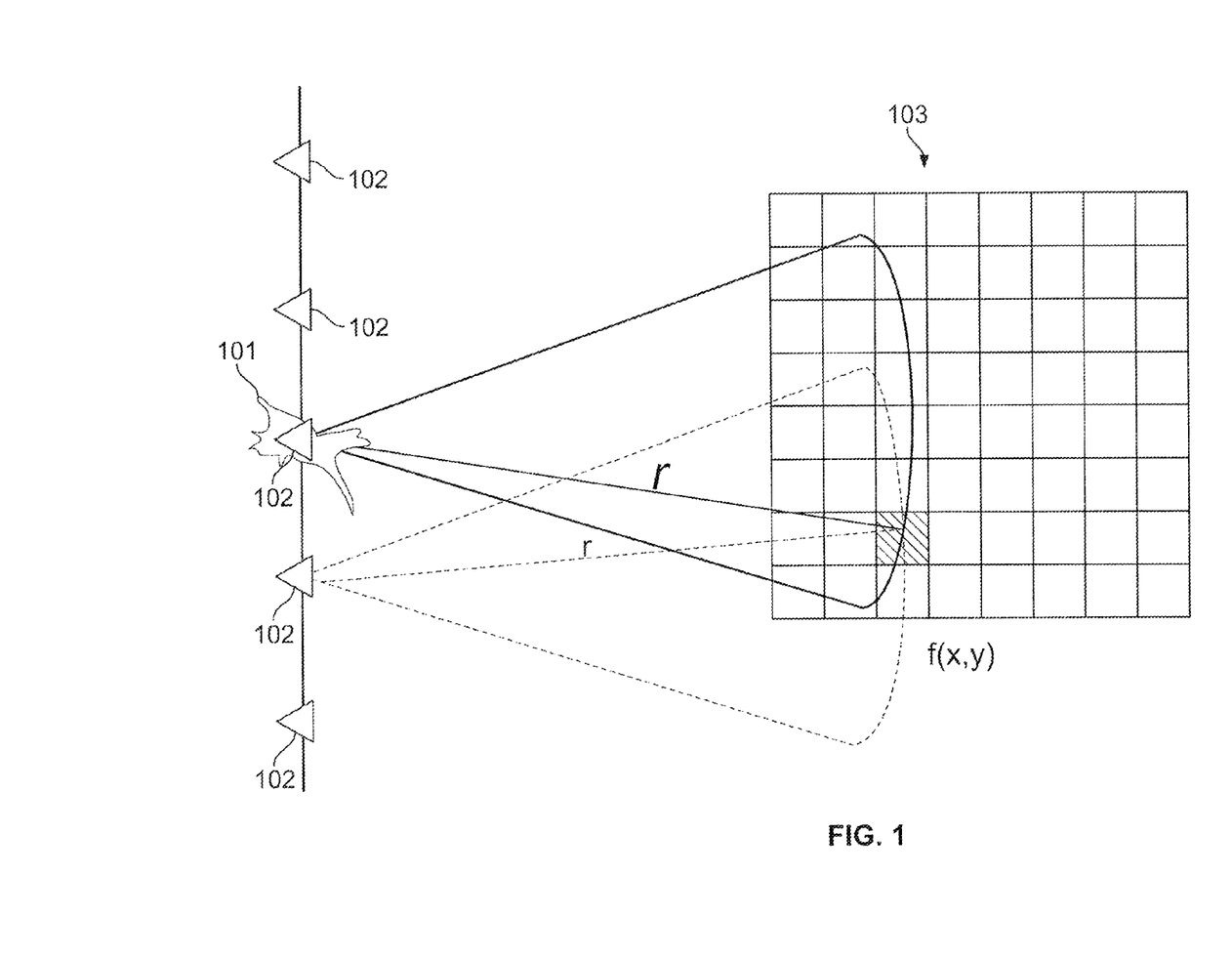
FIG. 1 shows how a radar image may be formed from an array of samples.

As seen in FIG. 1, a radar image of aircraft or other target 101 based on radar samples 102 may take the form of an array 103. The array may be determined from:

$$f(x, y) = \sum_{k} f_{x,y}(r_k, \theta_k) \cdot e^{j\omega 2 \cdot |\vec{r}_k|}$$

However, $r_k$ is known only where it has been sampled. For greater resolution, $r_k$ can be interpolated in accordance with embodiments of the invention.

Figure 2:
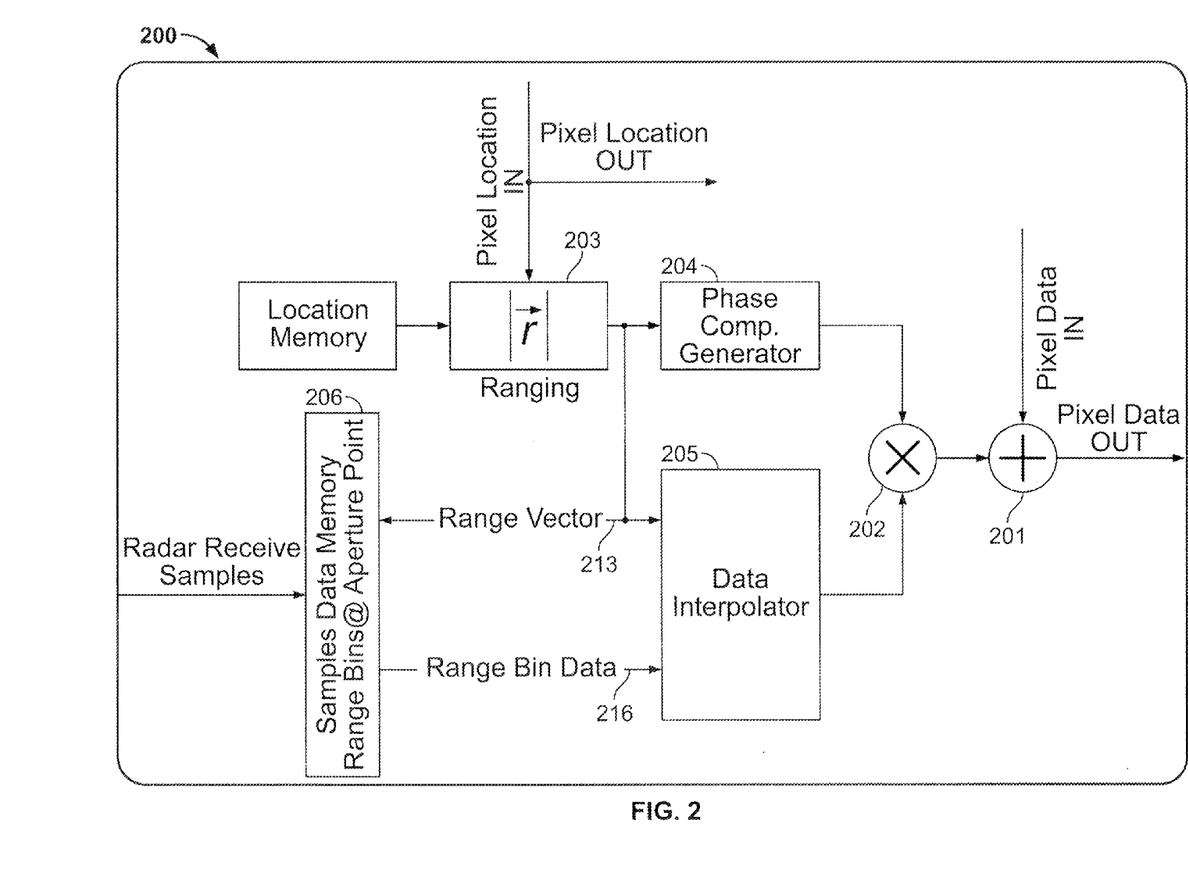
FIG. 2 shows a simplified representation of back-projection circuitry that can be used to form a radar image.

FIG. 2 is a simplified representation of back-projection circuitry 200 which can be used to compute f(x,y). Adder/accumulator 201 performs the outer summation of the product terms which are computed by multiplier 202. The desired range r is determined at ranging block 203, and input to phase compensation generator 204 which computes the exponential portion of each term of the summation, representing phase compensation. Range r also is converted to an index 213 and input to data interpolator 205 and to sample memory 206, which in turn provides the samples 216 represented by the index to data interpolator 205, which provides to multiplier 202 the f(r,θ) input for each term of the summation.

As discussed above, to obtain the inputs for data interpolator 205, it is known either to read each input during a separate clock cycle, or to store multiple copies of the radar samples in memory 206 so that multiple copies can be read out during a single clock cycle. The former approach requires additional clock cycles (e.g., twice as many clock cycles in the case of linear interpolation where each point is interpolated from two samples, or four times as many clock cycles in the case of cubic interpolation where each point is interpolated from four samples), while the latter approach requires additional memory (e.g., twice as much memory in the case of linear interpolation where each point is interpolated from two samples, or four times as much memory in the case of cubic interpolation where each point is interpolated from four samples).

Figure 3:
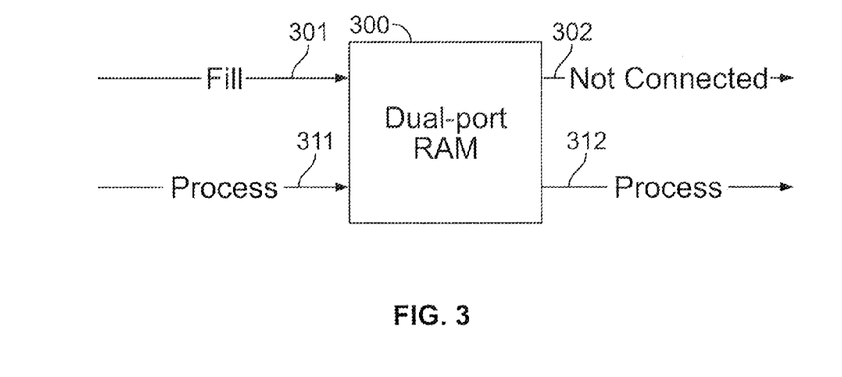
FIG. 3 shows a first configuration of a dual-port memory.
Figure 4:
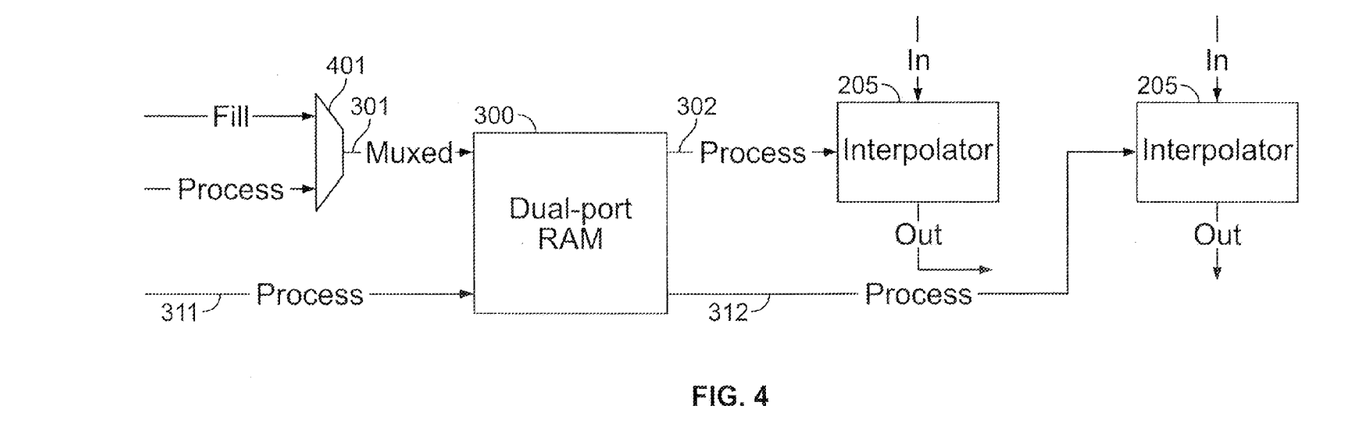
FIG. 4 shows a second configuration of a dual-port memory.

It has been proposed to use dual-port memory to overcome these limitations. However, as shown in FIG. 3, one write port 301 of dual-port memory 300 is used to store samples, so its counterpart read port 302 is not available. Therefore, only write port 311 and read port 312 are available for the processing of data to be interpolated. Therefore, in effect, dual-port memory 300 operates as a single-port memory for the purposes of interpolation. As another alternative, FIG. 4 shows how write port 301 of dual-port memory 300 can be multiplexed at 401 so that write port 301 can be used both for sample storage and processing of data, allowing read port 302 also to be used. Both occurrences 402, 403 of an "Interpolator" may represent interpolator 205 of FIG. 2. However, this arrangement is not optimal. For example, even under this arrangement, write port 301 is not available full time, so throughput is still reduced. Nevertheless, this arrangement may be advantageous where there is a benefit to storing a single set of samples for both interpolator blocks Therefore, in accordance with embodiments of this invention, the input samples are stored only once, but divided, as discussed above, into a number of groups reflecting the degree of interpolation. The total amount of memory needed is only the amount needed to store all samples once, although a separate physical memory is required for each group of samples.

Figures 5, 6:
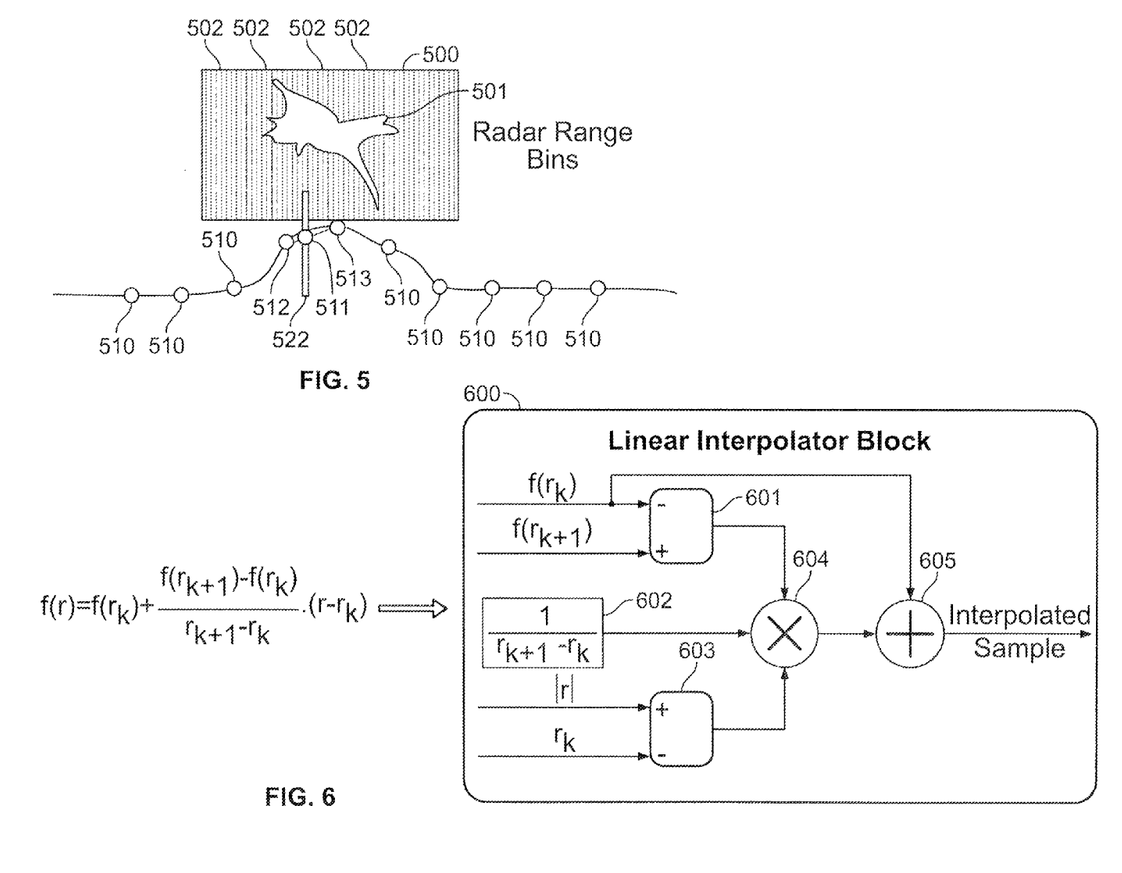
FIG. 5 shows a representative radar image.
FIG. 6 shows an implementation of interpolation circuitry.

Taking the example of linear interpolation, FIG. 5 shows an image 500 of a target 501. Image 500 is broken into slices 502 representing different portions of the surface of target 501, each of which is at a different range from the observation point (e.g., the location of the radar antenna in a radar implementation). There are samples 510, 512, 513 for only some of slices 502. The range to each of the other slices 502 can be determined by interpolating. For example, point 511, representing the range to slice 522, can be estimated by interpolating samples 512, 513.

That interpolation, and a circuit implementation 600 for performing that interpolation, are shown in FIG. 6. r is the index of slice 522, and $r_n$ is the index of the nth sample (n=k or k+1). f(r) is the value of the desired interpolated point. $f(r_k)$ is the value of the lower one 512 of the two known samples, while $f(r_{k+1})$ is the value of the upper one 513 of the two known samples. The interpolation is straightforward: The slope of the line connecting the known sample points is computed and multiplied by the horizontal distance from the lower end of the line to the horizontal location of slice 522, and that result is added to the value of sample 512.

To compute the numerator of the slope, the difference between the values $f(r_{k+1})$ and $f(r_k)$ of the two sample points 513, 512 is taken at subtractor 601. The denominator of the slope is a known constant (the interval between samples) that is entered at 602. The horizontal distance from the lower end of the line to the horizontal location of slice 522 is computed by subtracting $r_k$ from r at subtractor 603. The two differences 601, 603 and the constant 602 are multiplied by multiplier 604, and that product is added by adder 605 to $f(r_k)$ to yield the interpolated result.

Figure 7:
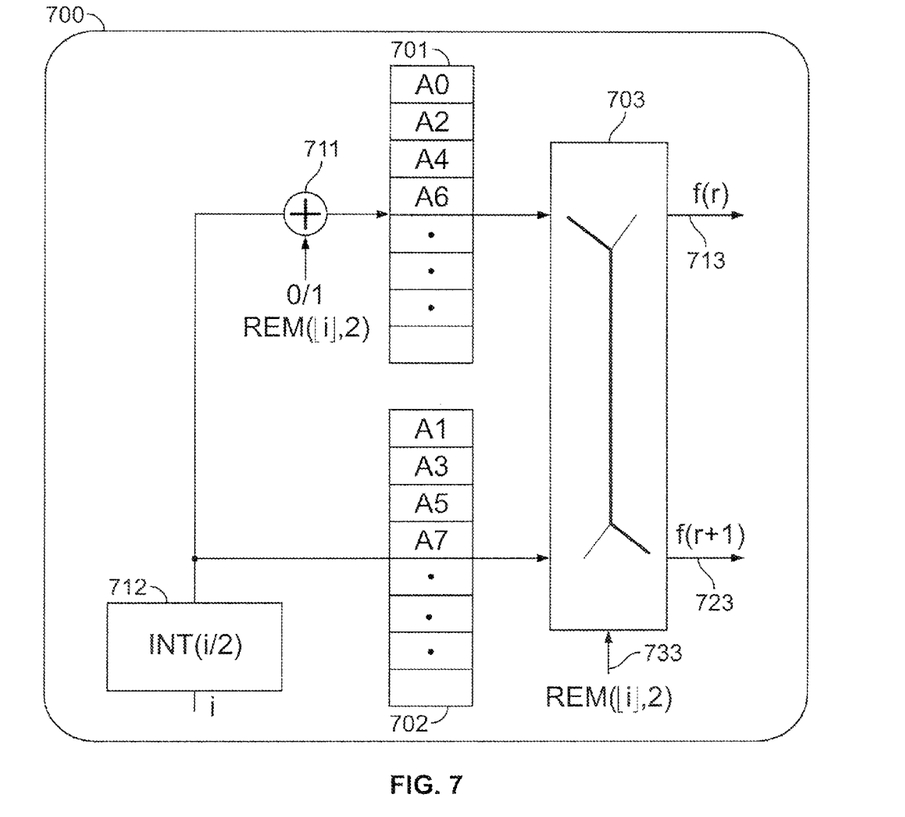
FIG. 7 shows an implementation of interpolation circuitry according to an embodiment of the invention.

Embodiments of this invention are directed to extracting all samples from the sample storage within one clock cycle. In the context of FIGS. 5 and 6, that means extracting the two samples $f(r_k)$ and $f(r_{k+1})$ within one clock cycle. FIG. 7 shows one implementation 700 for doing so. As seen, the sample storage is divided into two sample memories 701, 702. Sample memory 701 is used for even samples A0, A2, A4, A6, . . . , while sample memory 702 is used for odd samples A1, A3, A5, A7, . . . .

It will be appreciated that if the desired point to be interpolated falls between two samples, and if the sample numbers are used as addresses into the sample storage, the address 712 into the odd sample memory 702 for one of the two samples surrounding the desired point will be half the index of the lower one of the two samples. Thus, if in FIG. 7 i represents the non-integer "index" of the desired point (e.g., i=5.3 for a desired point about one-third of the way between points 5 and 6), then the address into the odd sample memory will be the integer part of one-half of the index of the lower sample (i.e., INT(i/2); in the example, the address is 2, which is the integer part of half of 5. It also will be appreciated that if the index of the lower sample point is even, then the address into the even sample memory will be the same as the address into the odd sample memory, while if the index of the lower sample point is odd, the address into the even sample memory will be one higher than the address into the odd sample memory. This can be represented by adding REM([i], 2) to INT(i/2) at adder 711.

The values output from the two memories 701, 702 are input to crossbar switch 703 and either passed straight through to outputs 713, 723 as $f(r_k)$, $f(r_{k+1})$, respectively, or swapped and outputted as $f(r_{k+1})$, $f(r_k)$, respectively. It will further be appreciated that swapping will be necessary when the output of memory 701 has a higher index than the output of memory 702, which occurs when '1' has been added at adder 711. Thus, the same value REM($\lfloor i \rfloor$, 2) that is added at adder 711 also controls crossbar switch 703 at 733.

As a numerical example, if i=2.3, then INT(i/2)=INT (1.15)=1. Using 1 as the address into memory 702 selects sample A3. REM($\lfloor i \rfloor$, 2)=REM(2,2)=0 so the address into memory 701 also is 1, which selects sample A2, and also sets crossbar switch 703 to pass-through mode. So $f(r_k)$=A2 and $f(r_{k+1})$=A3.

If i=3.7, then INT(i/2)=INT(1.85)=1. Using 1 as the address into memory 702 again selects sample A3. REM($\lfloor i \rfloor$/2)=REM(3/2)=1 so the address into memory 701 is 2, which selects sample A4. REM($\lfloor i \rfloor$, 2)=REM(3,2)=1 also sets crossbar switch 703 to swap mode. So $f(r_k)$=A3 and $f(r_{k+1})$=A4.

Figure 8:
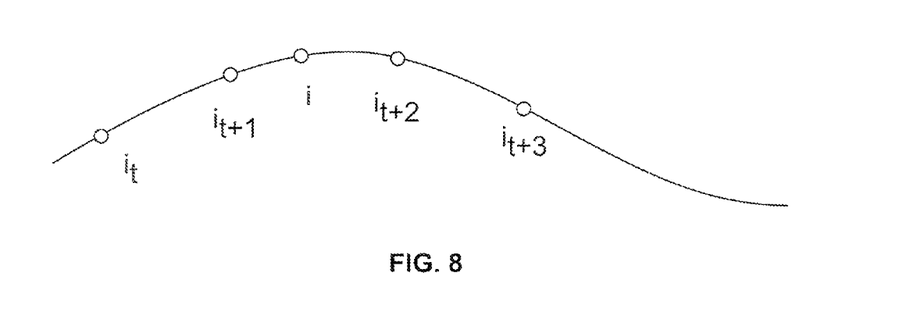
FIG. 8 shows four samples for a higher-order interpolation.

In other types of interpolations, it may be necessary to extract more than two samples in the same time. For example in a cubic interpolation, four samples would be used—two samples to left of the desired point and two samples to the right of the desired point. As shown in FIG. 8, for point i, the two samples to the left are $i_t$ and $i_{t+1}$, while the two samples to the right are $i_{t+2}$ and $i_{t+3}$. $i_t$ represents a valid trailing edge of a series of four required samples and is calculated from i:

$$i_t = \lfloor i \rfloor - 1$$

Figure 9:
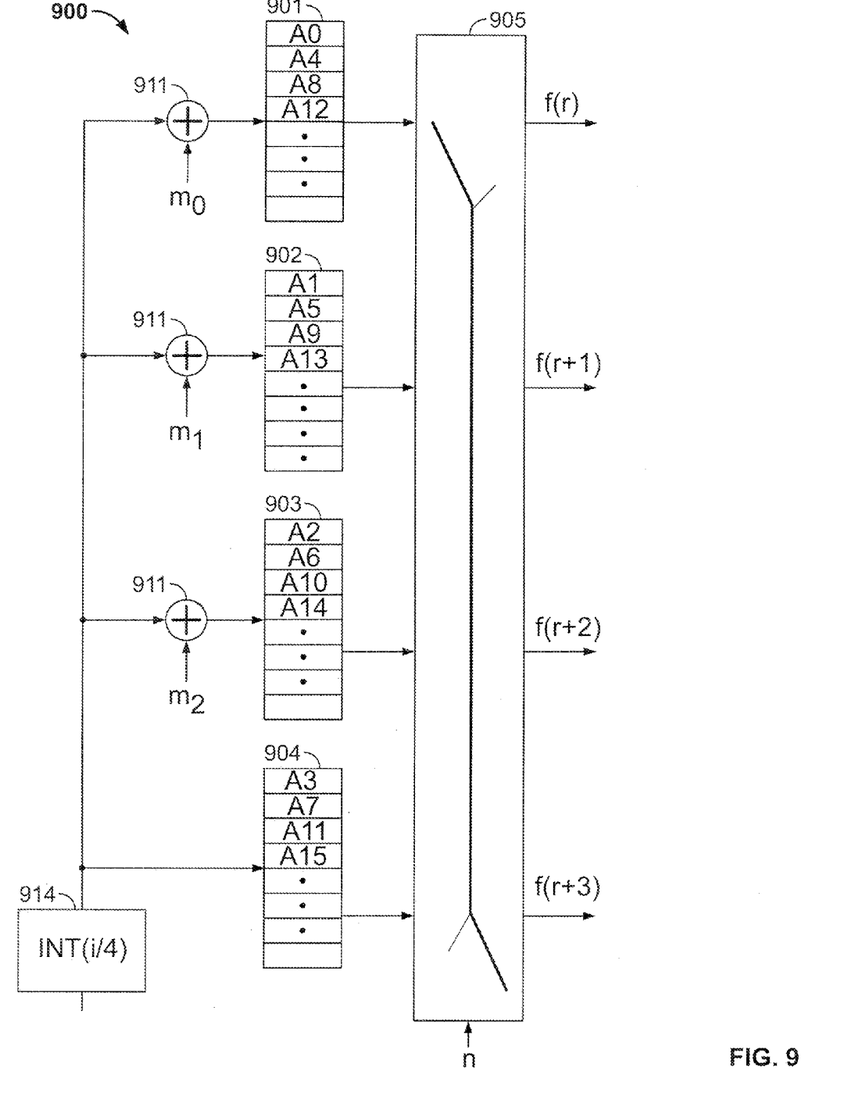
FIG. 9 shows an implementation of circuitry for a higher-order interpolation.

The circuit 900 for extracting the samples for such an interpolation would be similar to the linear interpolation case. As shown in FIG. 9, the sample storage would be divided into four sample memories 901, 902, 903, 904. Sample memory 901 would be used for samples A0, A4, A8, A12 ..., sample memory 902 would be used for samples A1, A5, A9, A13 ..., sample memory 903 would be used for samples A2, A6, A10, A14 ..., and sample memory 904 would be used for samples A3, A7, A11, A15 .... Instead of a crossbar switch, the outputs of the sample memories would be input to a circular barrel shifter or similar circuit 905, which would rotate the samples cyclically based on shift parameter n.

The address 914 into sample memory 904 would be INT(i/4). The addresses into the other sample memories 901-903 would be determined by adding $m_0$, $m_1$ or $m_2$, respectively, to INT(i/4) at adders 911, where each of $m_0$, $m_1$ or $m_2$ could be '0' or '1' based on REM($\lfloor i \rfloor$, 4), according to the following table, which also shows the corresponding values of shift parameter n:

| REM ($\lfloor i \rfloor$, 4) | $m_0$ | $m_1$ | $m_2$ | Shift Parameter (n) |
| --- | --- | --- | --- | --- |
| 0 | 0 | 0 | 0 | 3 |
| 1 | 1 | 0 | 0 | 0 |
| 2 | 1 | 1 | 0 | 1 |
| 3 | 1 | 1 | 1 | 2 |

Figure 10:
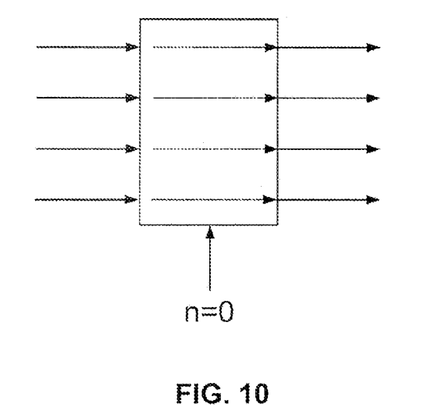
FIGS. 10-13 show shift patterns for shifting circuitry for a higher-order interpolation.
Figure 11:
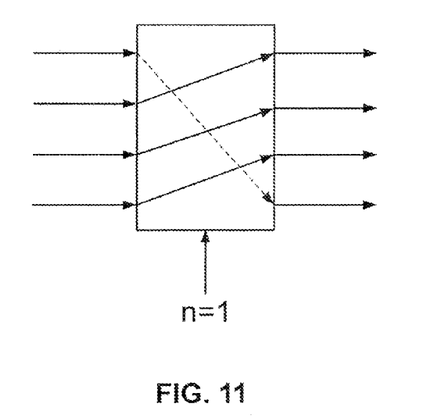
Figure 12:
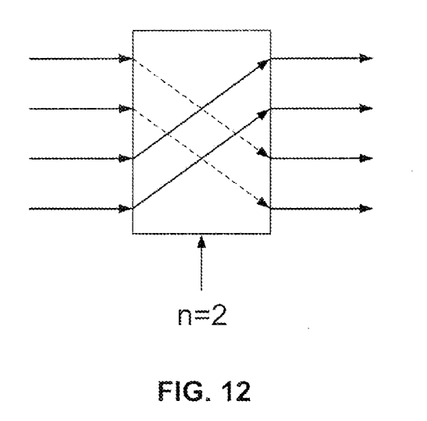
Figure 13:
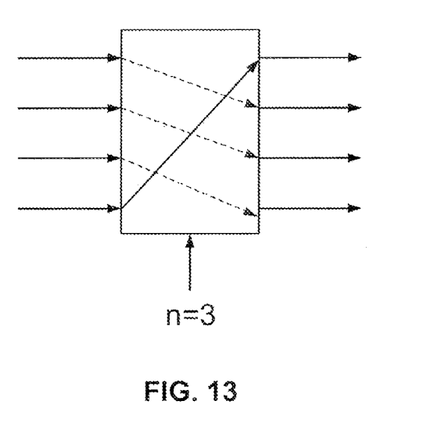

FIG. 10 shows the shift pattern for n=0. FIG. 11 shows the shift pattern for n=1. FIG. 12 shows the shift pattern for n=2. FIG. 13 shows the shift pattern for n=3.

Figure 14:
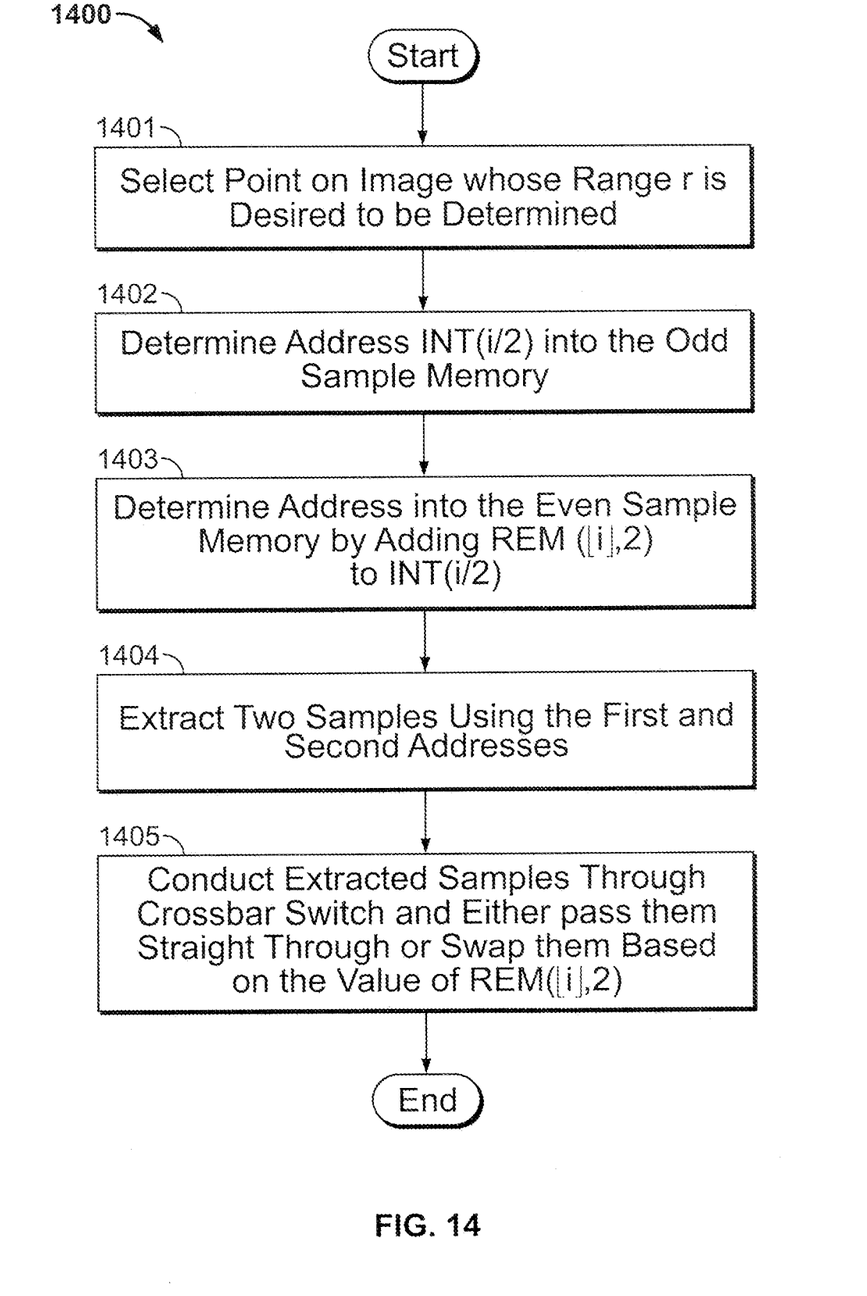
FIG. 14 is a flow diagram of a method according to an embodiment of the present invention for operating circuitry incorporating the present invention to perform interpolation.

A method 1400 of operating circuitry such as that shown in FIGS. 2-7 is diagrammed in FIG. 14. At 1401, the point on image 500 whose range r is desired to be determined is selected, which determines the index i. At 1402, a first address, into odd sample memory 702, is determined from INT(i/2). At 1403, the value of REM($\lfloor i \rfloor$, 2) is determined, and is added to INT(i/2) to derive a second address, into even sample memory 701. At 1404, the two samples are extracted using the first and second addresses. At 1405, the extracted samples are conducted through crossbar switch 703 and are either passed straight through or swapped or rotated based on the value of REM($\lfloor i \rfloor$, 2). Circuitry such as that shown in FIGS. 8-13 would operate similarly, except that instead of being controlled by REM($\lfloor i \rfloor$, 2), the addressing of samples and selection of rotation patterns would be determined in accordance with the table above.

Circuitry such as that shown in FIGS. 2-13 may be formed in a fixed device such as an application-specific standard product (ASSP) or application-specific integrated circuit (ASIC). Alternatively, such circuitry may be created by configuring a programmable integrated circuit device, which may be a programmable logic device (PLD) such as a field-programmable integrated circuit (FPGA). For example, an FPGA available from Altera Corporation, of San Jose, Calif., may be configured as such circuitry by describing the circuitry in a programming tool such as the QUARTUS® programming software provided by Altera Corporation, which sets configurable portions of the FPGA to form the desired circuitry.

As noted above, the interpolation circuitry described herein may be part of any kind of larger circuitry that requires interpolation to operate. One such example is circuitry for the radar application described above. If the interpolation circuitry is formed by configuring an FPGA, that FPGA also may be configured—again by using a suitable configuration tool as described above—to include the larger circuitry (such as radar circuitry).

Thus it is seen that interpolation circuitry, and methods for configuring and operating such circuitry, have been provided.

An FPGA or other PLD 180 configured to include interpolation circuitry according to an implementation of the present invention, whether or not including additional circuitry, may be used in many kinds of electronic devices. One possible use is in an exemplary data processing system 1800 shown in FIG. 15. Data processing system 1800 may include one or more of the following components: a processor 1801; memory 1802; I/O circuitry 1803; and peripheral devices 1804. These components are coupled together by a system bus 1805 and are populated on a circuit board 1806 which is contained in an end-user system 1807.

Figure 15:
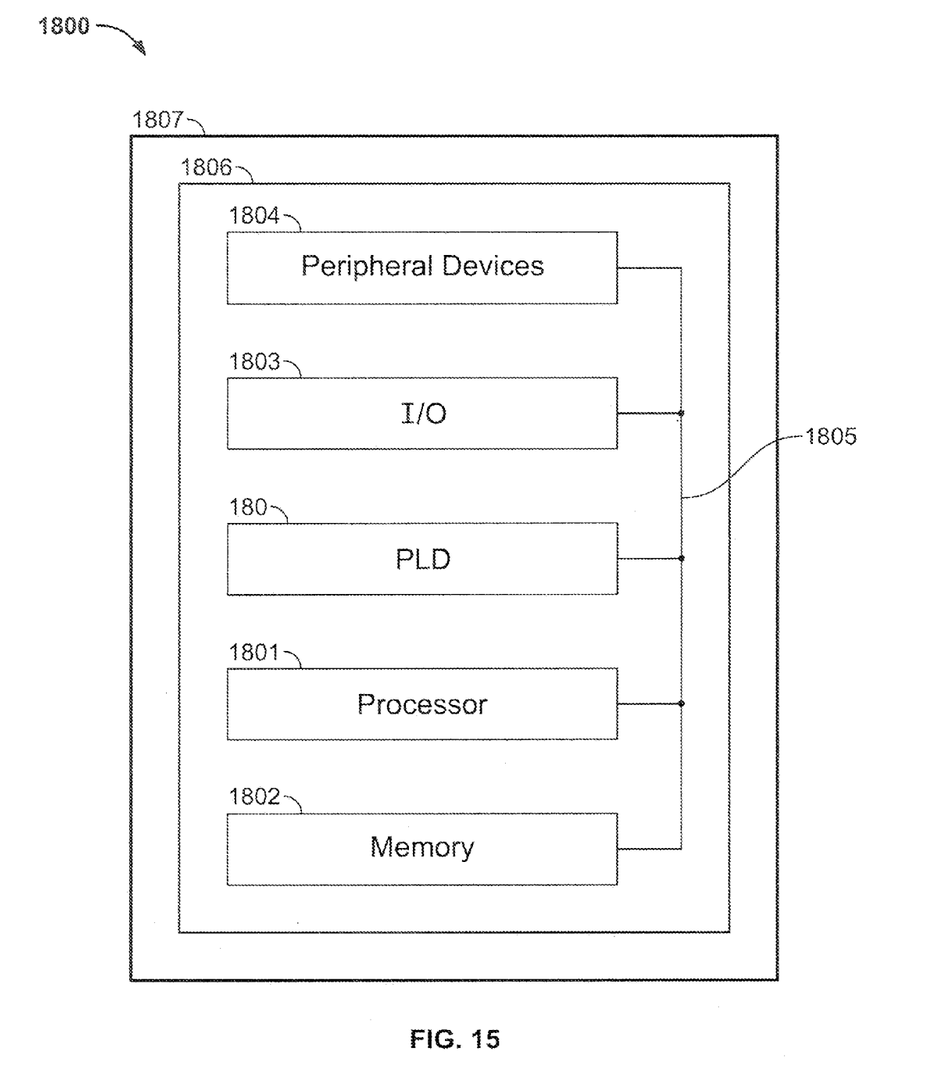
FIG. 15 shows a simplified block diagram of an exemplary system employing a programmable logic device incorporating the present invention.

System 1800 can be used in a wide variety of applications, such as computer networking, data networking, instrumentation, video processing, digital signal processing, Remote Radio Head (RRH), or any other application where the advantage of using programmable or reprogrammable logic is desirable. PLD 180 can be used to perform a variety of different logic functions. For example, PLD 180 can be configured as a processor or controller that works in cooperation with processor 1801. PLD 180 may also be used as an arbiter for arbitrating access to a shared resources in system 1800. In yet another example, PLD 180 can be configured as an interface between processor 1801 and one of the other components in system 1800. It should be noted that system 1800 is only exemplary, and that the true scope and spirit of the invention should be indicated by the following claims.

Various technologies can be used to implement PLDs 180 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. Interpolation circuitry for interpolating a value based on a first plurality of samples from within a larger second plurality of samples, said interpolation circuitry comprising:
    storage for said second plurality of samples, including a plurality of sample memories corresponding in number to said first plurality of samples, wherein samples in said second plurality of samples are distributed uniformly among said plurality for sample memories, each pair of adjacent samples in one of said sample memories corresponding to samples in said second plurality of samples separated by other samples numbering one less than said number;
    circuitry that receives an input index corresponding to said value and derives a first sample address into a first one of said sample memories by dividing a floor of said index by said number;
    respective circuitry for each respective other one of said sample memories that derives a respective other sample address from said first sample address based on a remainder of dividing said floor of said index by said number; and
    shifting circuitry that receives as inputs, in a first order, samples selected by said first sample address and each respective other sample address, and outputs said selected samples in a second order under control of a value determined by said remainder.

2. The interpolation circuitry of claim 1, wherein said circuitry that derives said first sample address outputs as said first sample address an integer part of a result of said dividing said floor of said index by said number.

3. The interpolation circuitry of claim 1, for performing linear interpolation, wherein:
    said number is two.

4. The interpolation circuitry of claim 3, wherein:
    said first one of said sample memories stores odd ones of said second plurality of samples;
    there is one other one of said sample memories; and
    said one other one of said sample memories stores even ones of said second plurality of samples.

5. The interpolation circuitry of claim 3, wherein:
    said respective circuitry for each respective other one of said sample memories that derives a respective other sample address from said first sample address adds said remainder to said first sample address.

6. The interpolation circuitry of claim 3, wherein:
    said shifting circuitry is a crossbar switch that accepts two input values in a first order and outputs said input values in either said first order or a swapped order based on said value determined by said remainder.

7. The interpolation circuitry of claim 6, wherein said value determined by said remainder is said remainder.

8. The interpolation circuitry of claim 1, wherein said number is four.

9. The interpolation circuitry of claim 8, wherein:
    said respective circuitry for each respective other one of said sample memories that derives a respective other sample address from said first sample address adds to said first sample address a respective predetermined value for each respective other one of said sample memories.

10. The interpolation circuitry of claim 8, wherein:
    said shifting circuitry is a circular shifter that accepts a plurality of input values in a first order and outputs said input values in either said first order or a circular permutation of said first order based on said value determined by said remainder.

11. The interpolation circuitry of claim 10, wherein said value determined by said remainder is a respective member of a set of predetermined values corresponding to respective value of said remainder.

12. A method of configuring a programmable integrated circuit device as interpolation circuitry for interpolating a value based on a first plurality of samples from within a larger second plurality of samples, said method comprising:
    configuring memory in said programmable integrated circuit device as storage for said second plurality of samples, including a plurality of sample memories corresponding in number to said first plurality of samples, wherein samples in said second plurality of samples are distributed uniformly among said plurality of sample memories, each pair of adjacent samples in one of said sample memories corresponding to samples in said second plurality of samples separated by other samples numbering one less than said number;
    configuring circuitry in said programmable integrated circuit device as circuitry that receives an input index corresponding to said value and derives a first sample address into a first one of said sample memories by dividing a floor of said index by said number;
    configuring respective circuitry in said programmable integrated circuit device for each respective other one of said sample memories that derives a respective other sample address from said first sample address based on a remainder of dividing said floor of said index by said number; and
    configuring shifting circuitry in said programmable integrated circuit device that receives as inputs, in a first order, samples selected by said first sample address and each respective other sample address, and outputs said selected samples in a second order under control of a value determined by said remainder.

13. The method of claim 12, wherein configuring said circuitry that derives said first sample address comprises configuring circuitry in said programmable integrated circuit device that outputs as said first sample address an integer part of a result of said dividing said floor of said index by said number.

14. The method of claim 12, for performing linear interpolation, wherein:
    said number is two.

15. The method of claim 14, comprising:
    configuring said first one of said sample memories to store odd ones of said second plurality of samples; and
    configuring one other one of said sample memories to store even ones of said second plurality of samples.

16. The method of claim 14, comprising:
    configuring said respective circuitry for each respective other one of said sample memories to derive said respective other sample address from said first sample address by adding said remainder to said first sample address.

17. The method of claim 14, comprising:
    configuring said shifting circuitry as a crossbar switch that accepts two input values in a first order and outputs said input values in either said first order or a swapped order based on said value determined by said remainder.

18. The method of claim 17, wherein said value determined by said remainder is said remainder.

19. The method of claim 12, wherein said number is four.

20. The method of claim 19, comprising:
configuring said respective circuitry for each respective other one of said sample memories to derive said respective other sample address from said first sample address by adding to said first sample address a respective predetermined value for each respective other one of said sample memories.

21. The method of claim 19, comprising:
configuring said shifting circuitry as a circular shifter that accepts a plurality of input values in a first order and outputs said input values in either said first order or a circular permutation of said first order based on said value determined by said remainder.

22. The method of claim 21, wherein said value determined by said remainder is a respective member of a set of predetermined values corresponding to respective value of said remainder.

23. A method of operating interpolation circuitry for interpolating a value based on a first plurality of samples from within a larger second plurality of samples, said method comprising:
selecting a point whose value is to be interpolated;
deriving an index of said point;
deriving a first address, into an odd sample memory, from said index;
deriving a second address, into an even sample memory, from said index;
extracting two samples from said odd and even sample memories using said first and second addresses;
passing said extracted samples through a crossbar switch in an order, and either leaving said order unchanged or swapping said order, based on a value derived from said index.

* * * * *